United States Patent [19]
Ihara

[11] Patent Number: 5,293,338
[45] Date of Patent: Mar. 8, 1994

[54] PERIPHERAL CIRCUIT IN A DYNAMIC SEMICONDUCTOR MEMORY DEVICE ENABLING A TIME-SAVING AND ENERGY-SAVING DATA READOUT

[75] Inventor: Makoto Ihara, Tenri, Japan

[73] Assignee: Sharp Kabushiki Kaisha, Osaka, Japan

[21] Appl. No.: 658,009

[22] Filed: Feb. 20, 1991

[30]    Foreign Application Priority Data

Feb. 22, 1990 [JP] Japan ............................ 2-43753
Mar. 14, 1990 [JP] Japan ............................ 2-63612
Dec. 19, 1990 [JP] Japan ........................... 2-403621

[51] Int. Cl.⁵ .................................................. G11C 7/00
[52] U.S. Cl. .............................. 365/194; 365/189.09; 365/203; 365/205
[58] Field of Search ................... 365/189.05, 189.09, 365/190, 194, 203, 205, 207, 208, 230.06

[56]     References Cited
U.S. PATENT DOCUMENTS

| | | | |
|---|---|---|---|
| 4,162,540 | 7/1979 | Ando | 365/197 |
| 4,748,596 | 3/1988 | Ogura et al. | 365/207 |
| 4,791,616 | 12/1988 | Taguchi et al. | 365/205 |
| 4,816,706 | 3/1989 | Dhong et al. | 307/530 |
| 4,916,671 | 4/1990 | Ichiguchi | 365/233 |
| 4,951,256 | 8/1990 | Tobita | 365/208 |
| 4,980,862 | 12/1990 | Foss | 365/203 |
| 5,053,998 | 10/1991 | Kannan et al. | 365/194 |

OTHER PUBLICATIONS

"Reduction of DRAM Sense Amplifier Peak Current by Preceded PMOS Drive Technique" published in the 70th Anniversary Memorial Nation-Wide Assembly of the Institute of Electronics, Information and Communication Engineers, 1987.

Primary Examiner—Stuart S. Levy
Assistant Examiner—Terry D. Cunningham

[57]            ABSTRACT

A peripheral circuit in a dynamic semiconductor memory device has a data line bias circuit and a timing generator circuit. The data line bias circuit has a switch connected between data lines and an internal voltage drop potential line having an intermediate potential between a power supply potential and a ground potential. When the switch is turned on, the data line bias circuit forms a current path connecting the internal voltage drop potential line and the data lines, and this current path is separated from ground. Therefore, electric current does not flow wastefully to ground. The timing generator circuit generates a control signal for activating pull-down transistors in a sense amplifier, a control signal for activating a column address decoder, and a control signal for activating pull-up transistors in the sense amplifier in that order, so that amplification of the signal on the bit lines, transfer of the amplified signal from the bit lines to the data lines, and bit line restoring are performed in that order.

12 Claims, 8 Drawing Sheets

PERIPHERAL CIRCUIT IN A DYNAMIC SEMICONDUCTOR MEMORY DEVICE ENABLING A TIME-SAVING AND ENERGY-SAVING DATA READOUT

BACKGROUND OF THE INVENTION

The present invention generally relates to a peripheral circuit in a dynamic semiconductor memory device which reduces the time required to output data to an external device and which reduces power consumption during data reading.

A conventional peripheral circuit in a dynamic semiconductor memory device has circuits as shown, for example, in FIG. 1 and FIG. 2. As shown in FIG. 1, the peripheral circuit includes a timing generator circuit 103, a plurality of sense amplifiers 104 (only one is shown for simplicity), column address decoders 105 for their corresponding sense amplifiers 104, and transfer gates 106 for each sense amplifier 104. As shown in FIG. 2, a main amplifier 101 and a data line bias circuit 102 are also provided. Note that ④ and ⑤ indicate that complementary data lines D and D#in FIG. 1 and FIG. 2 are connected to the respectively labelled lines therein.

As shown in FIG. 1, the timing generator circuit 103 has an inverter 103c connected to an input terminal 103i, and first and second delay circuits 103a and 103b serially connected to the inverter 103c. An n-channel transistor 103e is connected between ground and a pull-down transistor activation signal line 109, and a p-channel transistor 103f is connected between a pull-up transistor activation signal line 110 and a power supply.

After a start signal indicating that sense amplifier operation should begin is received at the input terminal 103i, the timing generator circuit 103 generates a control signal "a" to activate a pair of pull-down transistors 104b in a specific sense amplifier 104 through an inverter 103d from the output side of the inverter 103c as shown in FIGS. 1 and 3. The control signal "a" turns the n-channel transistor 103e on and pulls the pull-down transistor activation signal line 109 down to the ground potential.

Next, a control signal "c" to activate a pair of pull-up transistors 104a is generated from the output side of the first delay circuit 103a through inverters 103g and 103h. The control signal "c" turns the p-channel transistor 103f on, and pulls the pull-up transistor activation signal line 110 up to a power supply potential.

Finally, a control signal "b" is generated from the output side of the second delay circuit 103b through inverters 103j and 103k. This control signal "b" activates a column address decoder 105 and turns the transfer gates 106 on.

The main amplifier 101 shown in FIG. 2 consists of an n-channel transistor 101a connected to ground, a pair of n-channel pull-down transistors 101b connected to the n-channel transistor 101a, a pair of p-channel pull-up transistors 101c connected between the n-channel pull-down transistors 101b and the power supply (potential Vcc), and a p-channel transistor 101d to short-circuit complementary output lines O and O#. When a control signal $\phi6$ is applied, the main amplifier 101 amplifies the signals on the data lines D and D# for output to the output lines O and O# through the operation of the n-channel pull-down transistors 101b and the p-channel pull-up transistors 101c.

The data line bias circuit 102 shown in FIG. 2 consists of a pair of n-channel transistors 102a and another pair of n-channel transistors 102b and a p-channel transistor 102c to short-circuit the data lines D and D#. The n-channel transistor 102a and the n-channel transistor 102b are serially connected between the power supply (potential Vcc) and ground. A junction J of the transistors 102a and 102b is connected to the data line D and a junction J# of the other transistors 102a and 102b is connected to the other data line D#. The data line bias circuit 102 receives control signals $\phi3$ and $\phi4$ before data reading (precisely, before main amplifier 101 operation), and pre-biases the data lines D and D# to an intermediate potential Vcc/2 between the power supply potential and the ground potential.

When reading data from a memory cell, the bit lines B and B# as shown in FIG. 1 are biased to the intermediate potential Vcc/2 in advance by a pre-charge circuit not shown in the figures. The data lines D and D# are also biased to the intermediate potential Vcc/2 by the data line bias circuit 102 shown in FIG. 2. The timing generator circuit 103 shown in FIG. 1 then generates the control signal "a" and then the control signal "c", causing the pull-down transistor activation signal line 109 to be grounded and the pull-up transistor activation signal line 110 to be pulled up to the power supply potential. Thus, a weak potential difference transferred from the memory cell over the bit lines B and B# is amplified and latched by the sense amplifier 104. The timing generator circuit 103 then generates the control signal "b", and the transfer gates 106 are made continuous to the data lines D and D# by the column address decoder 105. As a result, the potential difference latched by the sense amplifier 104 is sent from the bit lines B and B# to the data lines D and D#. The main amplifier 101 shown in FIG. 2 then amplifies the potential difference on the data lines D and D#, and outputs the result to the output lines 0 and 0#.

The conventional peripheral circuit as described hereinabove, however, during data reading, drives the pull-down transistors 104b in the sense amplifier 104 first to pull down the potential of one of the bit lines B and B#, and then drives the pull-up transistors 104a to pull up the potential of the other of the bit lines B and B# before sending the data to the data lines D and D#. As a result, during the period from the start of sense amplifier operation until the start of data transfer to the data lines D and D#, operating time is required to pull down the potential of the bit lines B or B# (corresponding to the output timing difference between the control signals "a" and "c") and to pull up the potential of the bit line D# or D (corresponding to the output timing difference between the control signals "c" and "b"). As a result, a prolonged time is thus required for output of data over the output lines O and O# through the main amplifier 101.

In addition, when the data lines D and D# are pre-biased to the intermediate potential Vcc/2 before main amplifier operation begins, a DC current flows from the power supply Vcc to ground through the n-channel transistors 102b and 102a in the data line bias circuit 102. As a result, power consumption is greatly increased.

SUMMARY OF THE INVENTION

A first object of the present invention is therefore to provide a peripheral circuit in a dynamic semiconductor memory device which reduces the time from the start of sense amplifier operation to the output of data to the output lines.

A second object of the present invention is to provide a peripheral circuit in a dynamic semiconductor memory device which can reduce power consumption when the data lines are pre-biased to an intermediate potential before the start of main amplifier operation.

FIGS. 4 and 5 illustrate an embodiment of the present invention, and FIGS. 9A and 9B are timing charts of first, second and third control signals used in a peripheral circuit of a dynamic semiconductor memory device according to this embodiment of the present invention.

As shown in FIGS. 4, 5, and 9A and 9B, in the peripheral circuit in a dynamic semiconductor memory device comprising a plurality of sense amplifiers 4 each of which has a pair of pull-up transistors and a pair of pull-down transistors and is connected to complementary bit lines B and B# for sense-amplifying a potential difference between the complementary bit lines B and B#; a main amplifier 1 connected to complementary data lines D and D# for further amplifying the potential difference amplified by the sense amplifier 4; a data line bias circuit 2 for biasing the complementary data lines D and D# to an intermediate potential Vcc/2 between a power supply potential Vcc and a ground potential before operation of the main amplifier 1 starts; transfer gates 6 provided between each sense amplifier 4 and the complementary data lines D and D#; a plurality of column address decoders 5 for controlling the transfer gates 6 for respective ones of the sense amplifiers 4; and a timing generator circuit 3 for, in response to a start signal indicating that sense amplification should start, generating a first control signal "a" for activating the pull-down transistors 4b, a second control signal "c" for activating the pull-up transistors 4a and a third control signal "b" for activating the column address decoder 5 to turn on the transfer gates 6 in a predetermined order at a different timing, the timing generator circuit 3 according to an embodiment of the present invention generates, in response to the start signal, one of the first and second control signals "a" and "c", and then the third control signal "b" and finally the other of the first and second control signals "a" and "c" in that order at a different timing to perform sense amplification of the potential difference between the bit lines B and B# for a specific sense amplifier 4, output of the sense-amplified potential difference from the specific sense amplifier 4 to the complementary data lines D and D#, and restoring of the bit lines B and B# in that order.

The peripheral circuit as thus described operates as follows.

When the timing generator circuit generates the first control signal "a" activating the pull-down transistors, the third control signal "b" activating the column address decoder, and the second control signal "c" activating the pull-up transistors in that order, signal amplification on the bit lines, transfer of the amplified signal from the bit lines to the data lines, and bit line restoring occur in that order. In other words, when bit line restoring begins, the amplified signal has been transferred to the data lines via the transfer gates opened by the column address decoder. As a result, unlike with the conventional device, the period from the start of the sense operation until the data outputting to the data lines is equal to the time required to amplify the signal on the bit lines by the pull-down transistors. Therefore, a total time required to output the data to an external device is shortened.

Furthermore, the sense amplifier which amplified the signal from the specific memory cell to be read is pulled up to the potential of the data lines at the timing at which the transfer gates are opened by the column decoder specified by the column address signal. Therefore, the sense amplifier is restored at an earlier time than in the conventional device. It is to be noted that the sense amplifiers for the columns not specified start to be restored at the point that the, timing generator circuit generates the control signal for activating the pull-up transistors.

In addition, to accomplish the second object, as shown in FIG. 5, the data line bias circuit 2 according to an embodiment of the present invention is connected to an internal voltage drop potential line 7 having the intermediate potential Vcc/2, and has switch means 2a connected between the complementary data lines D and D# and the internal voltage drop potential line 7.

In this case, when the switch means forming part of the data line bias circuit is turned on, electric current flows between the internal voltage drop potential line and data lines, and the data lines are biased to the internal voltage drop potential. At this time the data line bias circuit forms a current path connecting the internal voltage drop potential line and the data lines, and this current path is separated from ground. Therefore, electric current does not flow wastefully to ground, and power consumption is reduced as compared with the conventional device.

BRIEF DESCRIPTION OF THE DRAWINGS

The present invention will become more fully understood from the detailed description given hereinbelow and the accompanying drawings which are given by way of illustration only, and thus are not limitative of the present invention, and wherein: 7

FIG. 7 shows another part of the peripheral circuit including a main amplifier and a data line bias circuit, and FIG. 8 shows a part of the peripheral including a sense amplifier, transfer gates, a main amplifier, a data line bias circuit;

DESCRIPTION OF PREFERRED EMBODIMENTS

Figure 6:
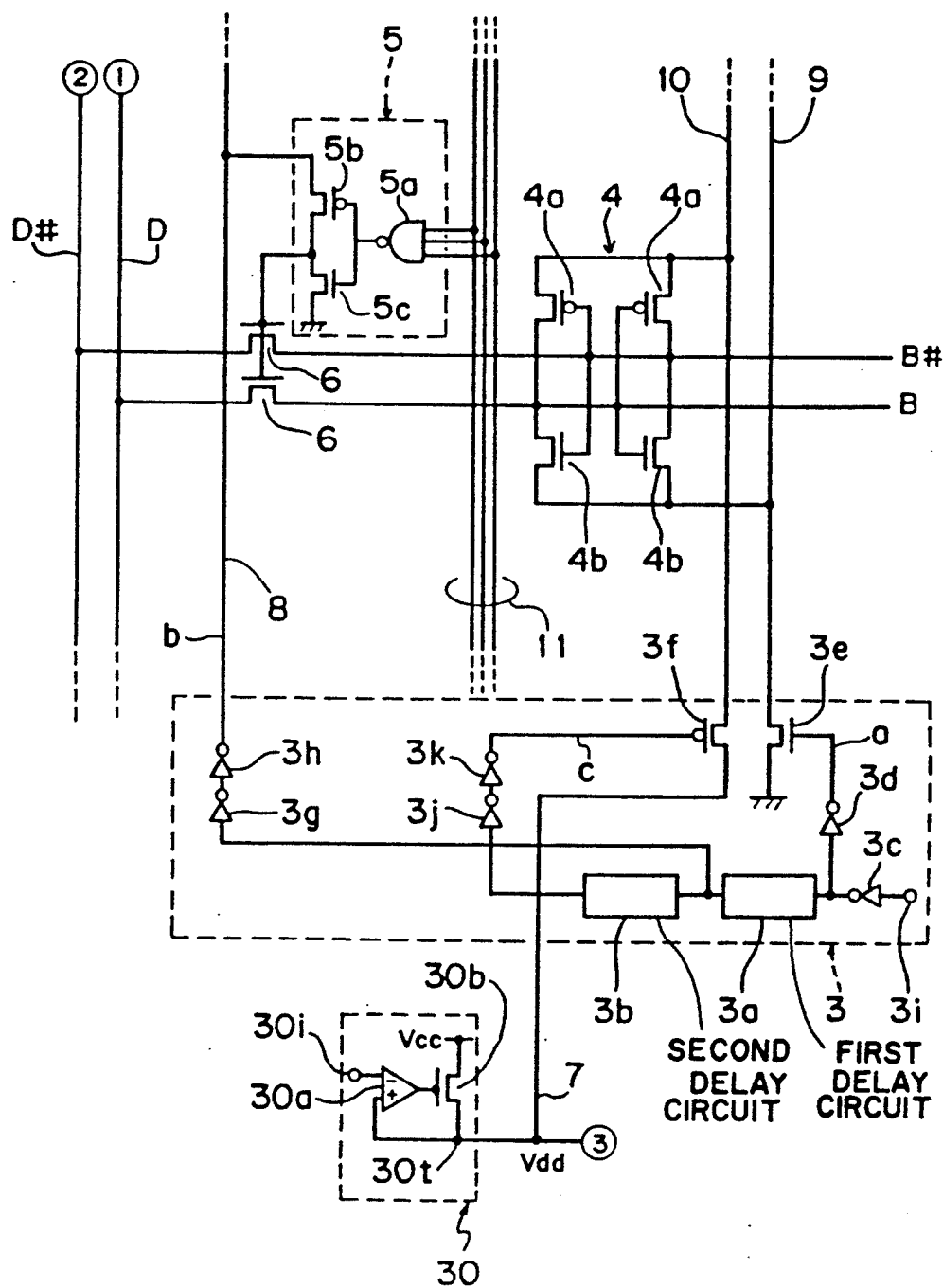
FIGS. 6, 7, and 8 are circuit diagrams showing a peripheral circuit in a dynamic semiconductor memory device according to an embodiment of the present invention, wherein FIG. 6 mainly shows one part of the peripheral circuit including a sense amplifier, a column address decoder, a timing generator circuit, etc.
Figure 7:
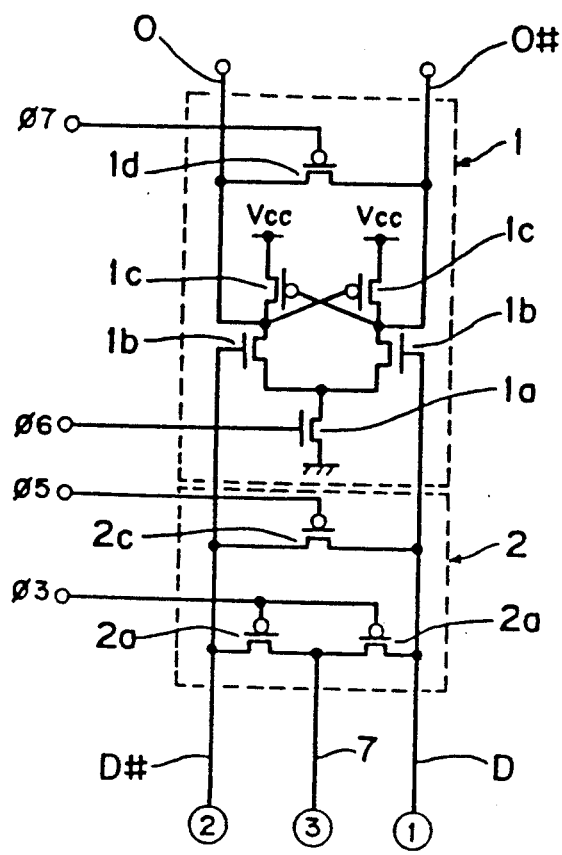
Figure 8:
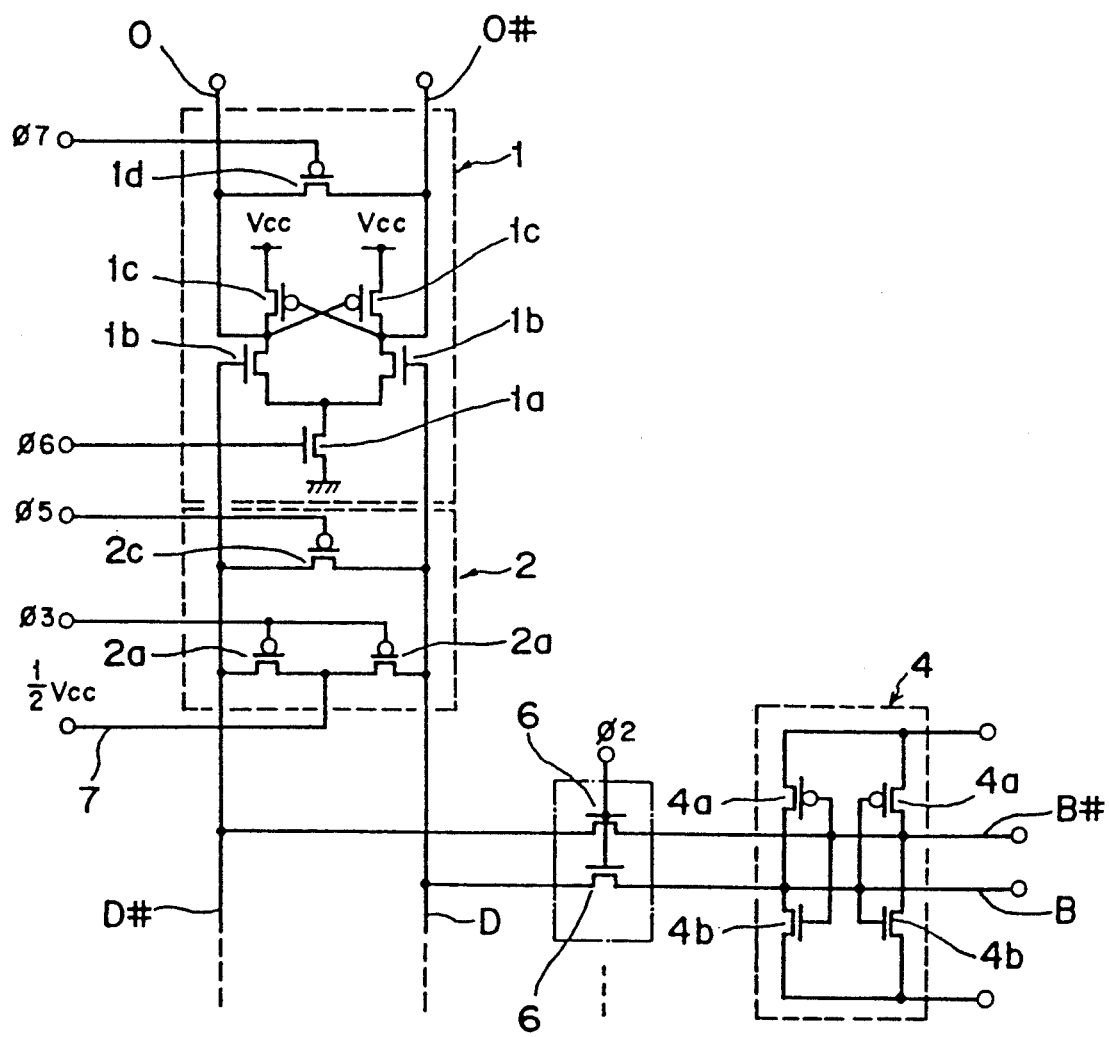
Figure 10:
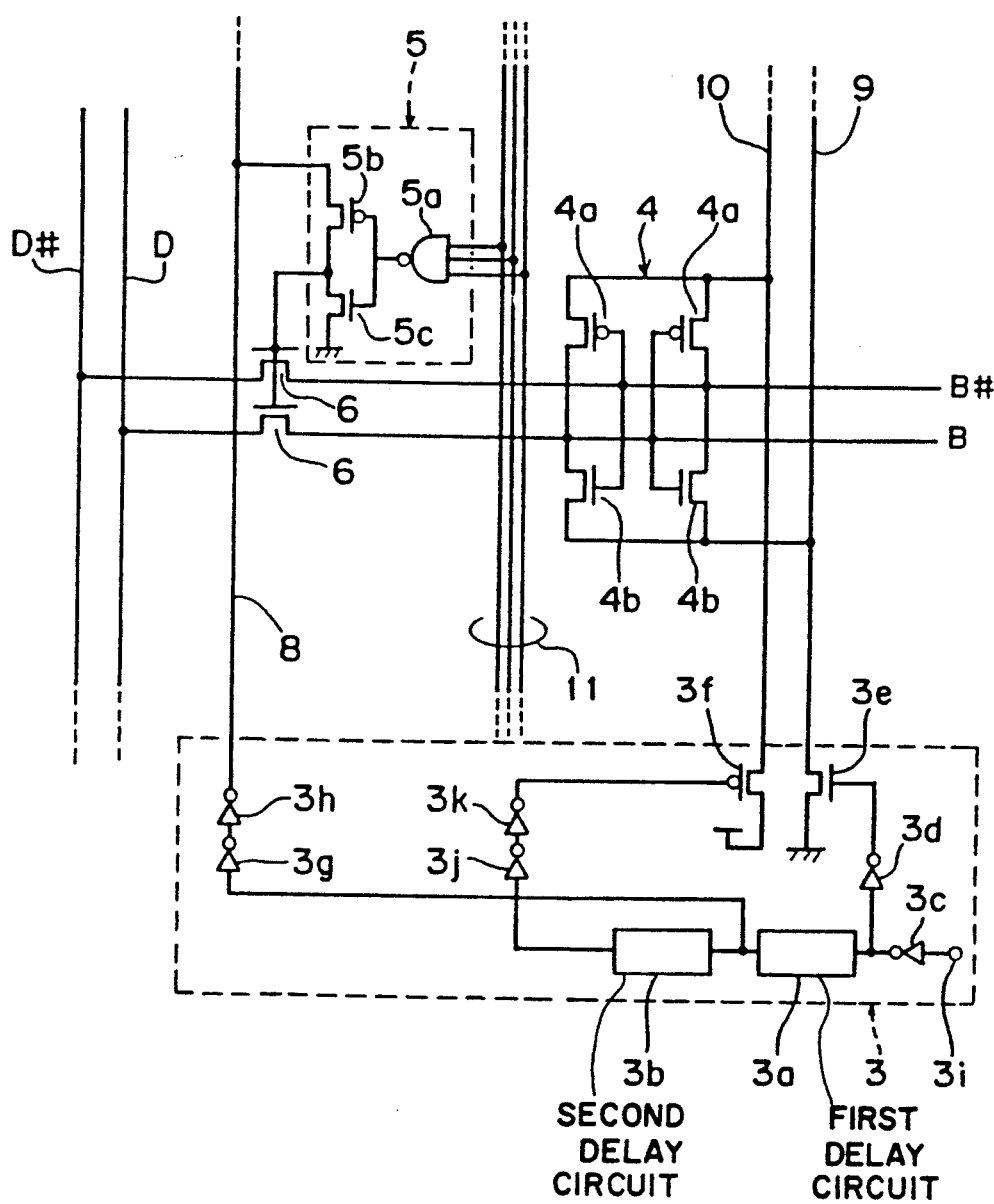
FIG. 10 is a circuit diagram showing an alternative embodiment of the present invention.

As shown in FIGS. 6 and 10, a peripheral circuit in a dynamic semiconductor memory device according to an embodiment of the present invention includes a timing generator circuit 3, a plurality of sense amplifiers 4 (only one is shown for simplicity), column address decoders 5 for the respective sense amplifiers 4 (only one decoder 5 is shown for simplicity), a plurality of pairs of transfer gates 6 connected between complementary bit lines B and B# and data lines D and D# (only one pair is shown for clarity), and an internal voltage drop circuit 30. The peripheral circuit also has a main amplifier 1 and a data line bias circuit 2 as shown in FIGS. 7 and 8. It is to be noted that the following description is made with reference to the sense amplifier 4 shown in the figure.

As shown in FIG. 6, the timing generator circuit 3 has an inverter 3c connected to an input terminal 3i, and first and second delay circuits 3a and 3b serially connected to the inverter 3c. An n-channel transistor 3e is connected between ground and a pull-down transistor activation signal line 9, and a p-channel transistor 3f is connected between a pull-up transistor activation signal line 10 and an internal voltage drop potential line 7.

Figure 9A:
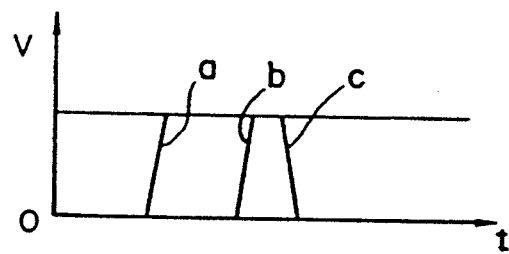
FIGS. 9A and 9B are timing charts of the first, second and third control signals used in the peripheral circuit according to an embodiment of the present invention.

After a start signal indicating that sense amplifier operation should begin is received at the input terminal 3i, the timing generator circuit 3 generates a control signal "a", as shown in FIG. 6 and FIG. 9A, to activate a pair of pull-down transistors 4b in the sense amplifier 4 through an inverter 3d from the output side of the inverter 3c. The control signal "a" turns the n-channel transistor 3e on and pulls the pull-down transistor activation signal line 9 down to the ground potential.

Next, a control signal "b" is generated from the output side of the first delay circuit 3a through inverters 3g and 3h. This control signal "b" activates the column address decoder 5 and turns the transfer gates 6 on.

Finally, a control signal "c" is generated from the output side of the second delay circuit 3b through inverters 3j and 3k to activate a pair of pull-up transistors 4a in the sense amplifier 4. The control signal "c" turns the p-channel transistor 3f on, and pulls the pull-up transistor activation signal line 10 up to an internal voltage drop potential Vdd.

As shown in FIGS. 6 and 10, the sense amplifier 4 has the pull-up transistors 4a connected to the pull-up transistor activation signal line 10, and the pull-down transistors 4b connected between the pull-up transistors 4a and the pull-down transistor activation signal line 9. This structure of the sense amplifier 4 is similar to that of the sense amplifier 104 of the conventional peripheral circuit of the semiconductor memory device. The sense amplifier 4 is driven by the pull-down transistor activation signal line 9 and the pull-up transistor activation signal line 10 to sense-amplify and latch the signal sent from a memory cell (not shown in the figures) over bit lines B and B#.

The column address decoder 5 has a NAND circuit 5a connected to column address signal lines 11, and a p-channel transistor 5b and an n-channel transistor 5c serially connected between a column address decoder activation signal line 8 and ground. This structure of the column address decoder 5 is also similar to that of the column address decoder 105 of the conventional peripheral circuit. When the column address decoder 5 is specified by the column address signal lines 11 and receives the control signal "b" from the timing generator circuit 3 via the column address decoder activation signal line 8, the column address decoder 5 turns the transfer gates 6 on and sends the signals on the bit lines B and B# to the data lines D and D#.

The internal voltage drop circuit 30 has a differential amplifier 30a and a p-channel transistor 30b connected between the power supply (Vcc potential) and an internal voltage drop potential line 7. The differential amplifier 30a takes a reference voltage Vref (where (Vcc/2) <Vref<Vcc) applied to an input terminal 30i as the inverted input, and the internal voltage drop potential Vdd from a junction 30t of the p-channel transistor 30b and the internal voltage drop potential line 7 as the non-inverted input, and controls the conductance of the p-channel transistor 30b so that the potential difference (Vdd−Vref) is approximately zero. In other words, a voltage follower is effectively formed by the differential amplifier 30a and the p-channel transistor 30b to supply an approximately constant internal voltage drop potential Vdd to the internal voltage drop potential line 7.

Figure 1:
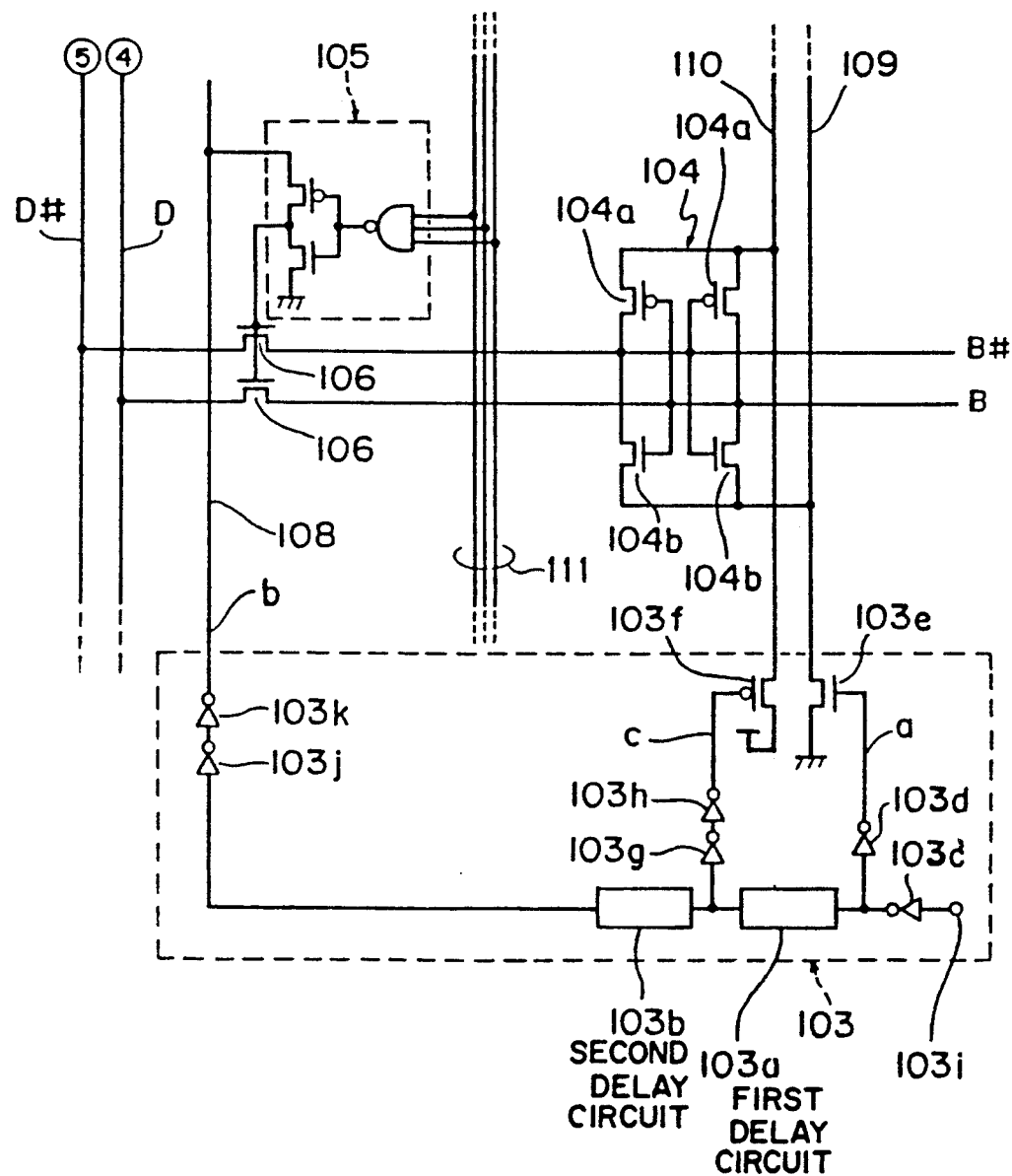
FIG. 1 is a circuit diagram showing one part of a peripheral circuit in a conventional dynamic semiconductor memory device.
Figure 2:
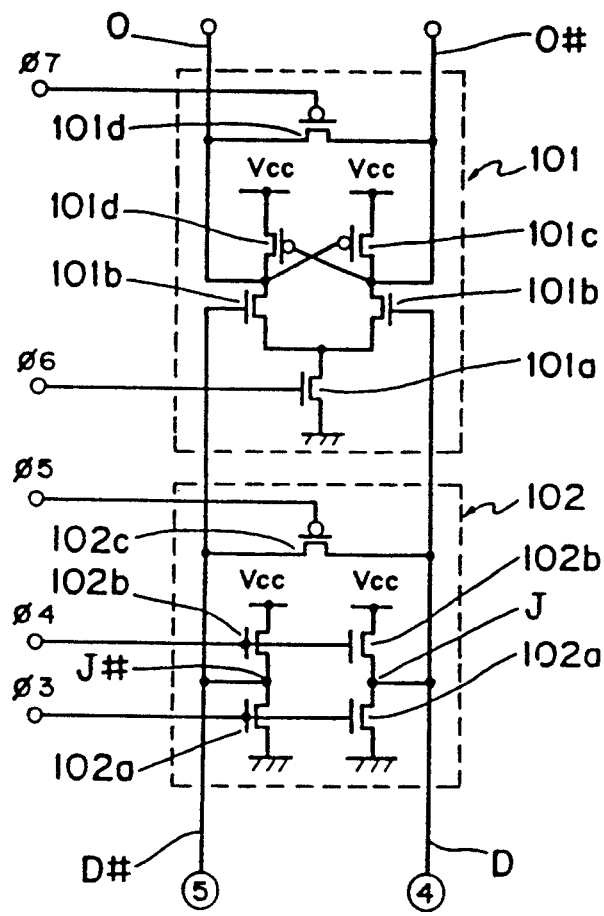
FIG. 2 is a circuit diagram showing another part of the peripheral circuit in the above conventional dynamic semiconductor memory device.
Figure 3:
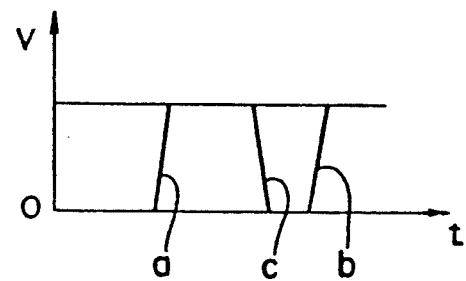
FIG. 3 is an operation timing chart of a timing generator circuit constructing part of the peripheral circuit in the conventional dynamic semiconductor memory device.
Figure 4:
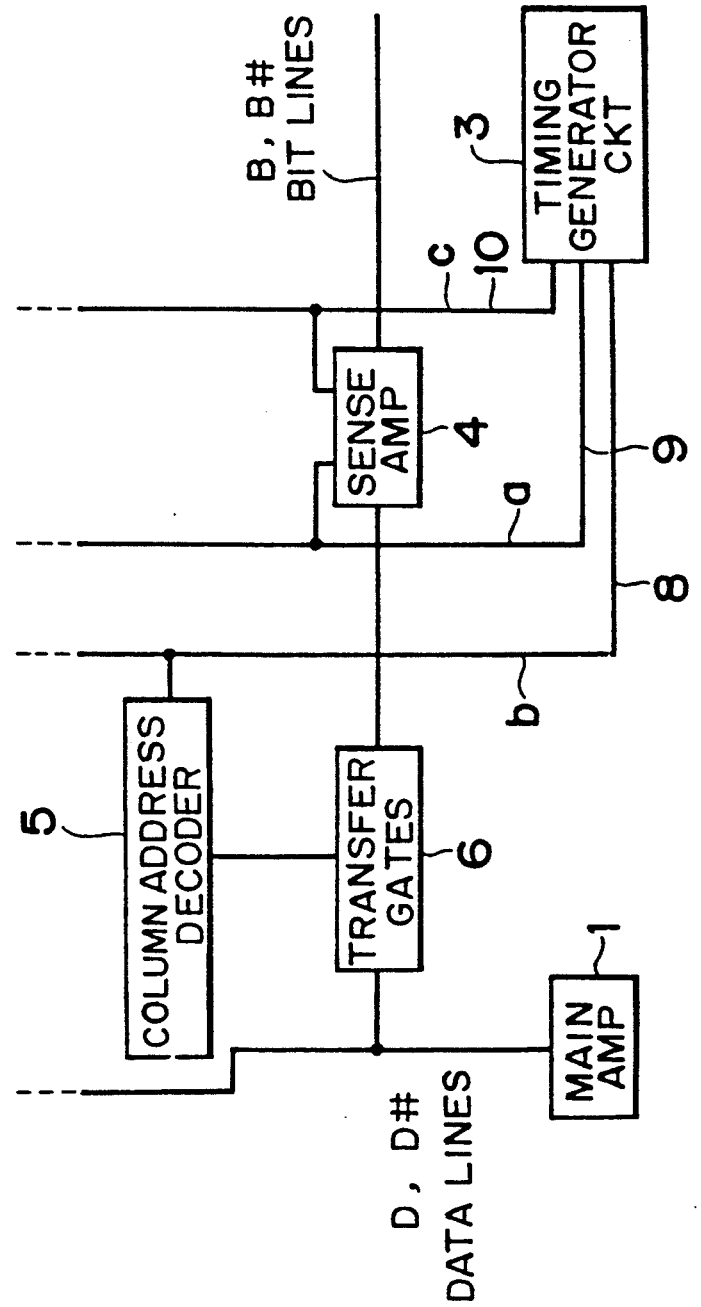
FIGS. 4 and 5 are diagrams illustrating an embodiment of the present invention.
Figure 5:
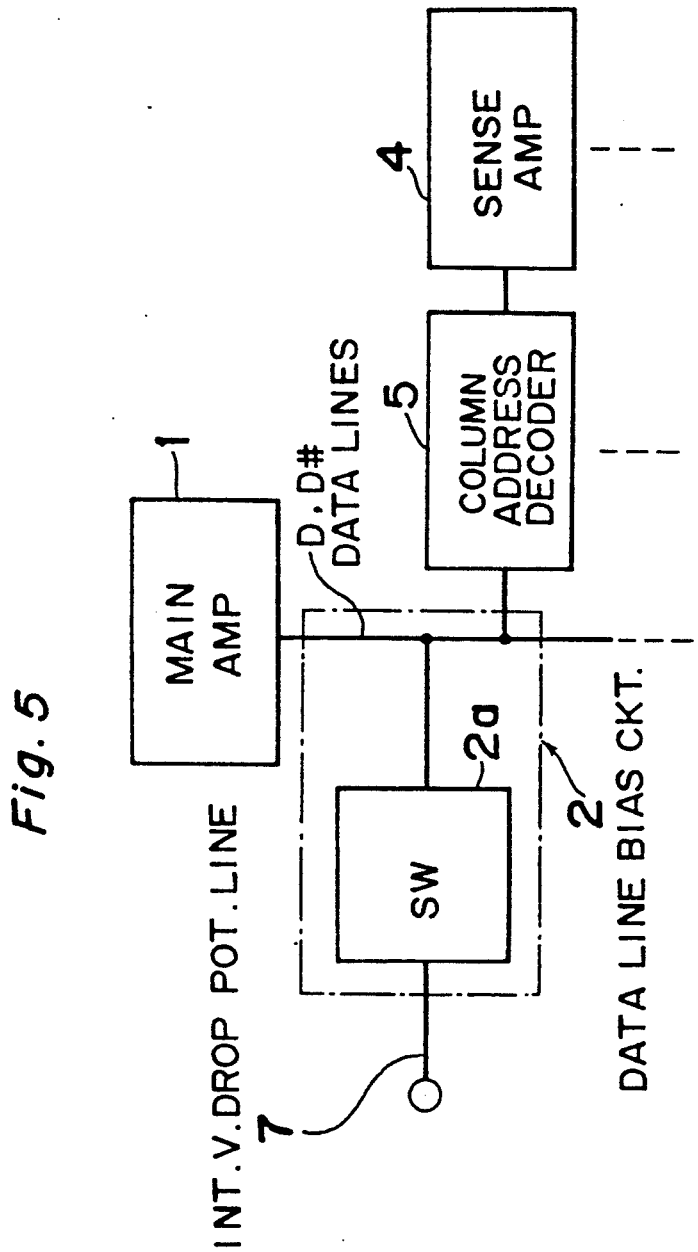

The main amplifier 1 shown in FIGS. 7 and 8, which is also similar to the main amplifier 101 of the conventional peripheral circuit as shown in FIG. 2, has an n-channel transistor 1a connected to ground, a pair of n-channel pull-down transistors 1b connected to the n-channel transistor 1a, a pair of p-channel pull-up transistors 1c connected between the n-channel pull-down transistors 1b and the power supply (potential Vcc), and a p-channel transistor 1d to short-circuit the output lines O and O#. When a control signal φ6 is applied, the main amplifier 1 amplifies the signals on the data lines D and D# for output to the output lines O and O# through the operation of the n-channel pull-down transistors 1b and the p-channel pull-up transistors 1c.

The data line bias circuit 2 has a pair of p-channel transistors 2a connected as a switch between the data lines D and D# and the internal voltage drop potential line 7, and a p-channel transistor 2c to short-circuit the data lines D and D#. In response to a control signal φ3, the data line bias circuit 2 biases the data lines D and D# to the potential Vdd of the internal voltage drop potential line 7 prior to data reading (precisely, prior to main amplifier operation).

When reading data from a memory cell, the bit lines B and B# shown in FIGS. 6 and 10 are biased to an intermediate potential Vcc/2 by a pre-charge circuit not shown in the figures. The data lines D and D# are also biased to the internal voltage drop potential Vdd by the data line bias circuit 2 shown in FIGS. 7 and 8. Specifically, by turning the p-channel transistors 2a on, electric current is caused to flow between the internal voltage drop potential line 7 and the data lines D and D#, and the data lines D and D# are thus set to the internal voltage drop potential Vdd. At this time, the data line bias circuit 2 forms a current path connecting the internal voltage drop potential line 7 and the data lines D and D#, and this current path is separated from ground. Therefore, the data lines D and D# can be biased without current flowing wastefully to ground, and power consumption can be reduced when compared with the conventional peripheral circuit in the dynamic semiconductor memory device.

After the bit lines B and B# and the data lines D and D# are so biased, the timing generator circuit 3 first generates the control signal "a" as shown in FIG. 9A, and grounds the pull-down transistor activation signal line 9. Then, a weak potential difference transferred from the memory cell (not shown) over the bit lines B and B# is amplified and latched by the sense amplifier 4. The timing generator circuit 3 then generates the control signal "b", and the transfer gates 6 are opened by the column address decoder 5 specified by the column address signal. As a result, the potential difference latched by the sense amplifier 4 is sent from the bit lines B and B# to the data lines D and D#. The main amplifier 1 further amplifies the potential difference between the data lines D and D#, and outputs the result to the output lines O and O#. Finally, the timing generator circuit 3 generates the control signal "c" to pull the pull-up transistor activation signal line 10 to the internal voltage drop potential Vdd, and thereby restore the bit lines B and B#.

As described above, amplification of the potential difference of the signals on the bit lines B and B#, transfer of the amplified signal from the bit lines B and B# to the data lines D and D#, and restoring of the bit lines B and B# occur in that order. Specifically, when restoring the bit lines B and B# starts, the amplified signal is already transferred to the data lines D and D#. This means that, unlike in the conventional dynamic semiconductor memory device, the period from the start of sense amplifier operation until data output to the data lines D and D# can be shortened to the time equal to that required only to amplify the signal on the bit lines B and B# by the pull-down transistors 4b. As a result, the time required to output the data to an external device can be shortened when compared with the conventional dynamic semiconductor memory device.

Furthermore, the sense amplifier 4, which amplified the signal read from the specific memory cell to be read is pulled up to the potential (which has already become the internal voltage drop potential Vdd at this point) of the data lines D and D# at the time at which the specified column address decoder 5 turns the transfer gates 6 on. Therefore, the sense amplifier 4 can be restored at an earlier point than is possible in the conventional dynamic semiconductor memory device. It is to be noted that the sense amplifiers 4 for other non-specified rows are started to be restored at the point that the timing generator circuit 3 generates the control signal "c".

The timing pattern for the control signals "a", "b" and "c" used in the above embodiment is shown in FIG. 9A.

It is to be noted that the pull-up transistor activation signal line 10 can also be connected to the power supply Vcc as shown in FIG. 10.

Figure 9B:
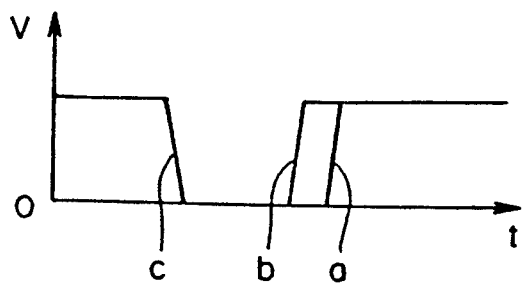

There is another timing pattern for the control signals "a", "b" and "c" which is shown in FIG. 9B.

According to the timing pattern in FIG. 9B, the control signal "c" which activates the pull-up transistors 4a of the sense amplifier 4 is output first. The control signal "b" is output next to activate the column address decoder 5 and turn the transfer gates 6 on. The output terminal of the sense amplifier 4 is thus connected to the data lines D and D#. Finally, the control signal "a" which activates the pull-down transistors 4b of the sense amplifier 4 is output. As a result, similarly to the case shown in FIG. 9A, amplification of the potential difference of the bit lines B and B#, output of the amplified potential difference from the sense amplifier 4 to the data lines D and D#, and restoring of the bit lines B and B# are performed in that order. In this case also, the period from the sense operation start to the data output to the data lines D and D# can be shortened to the time required only to amplify the potential difference of the bit lines B and B# by the pull-down transistors, and the time until the data is output to an external device can therefore be shortened.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A peripheral circuit in a dynamic semiconductor memory device comprising:

a plurality of sense amplifiers each of which includes a pair of pull-up transistors and a pair of pull-down transistors and is connected to complementary bit lines for sense-amplifying a potential difference between the complementary bit lines;

a main amplifier connected to complementary data lines for further amplifying the potential difference amplified by the sense amplifiers;

a power supply and a ground for feeding power to the dynamic semiconductor memory device;

a data line bias circuit for biasing the complementary data lines to an intermediate potential between a power supply potential of said power supply and said ground before said main amplifier starts operating;

transfer gates provided between each sense amplifier and the complementary data lines;

a plurality of column address decoders for controlling the transfer gates for respective ones of the sense amplifiers; and a timing generator circuit for, in response to a start signal indicating that sense amplification should start, generating a first control signal for activating the pair of pull-down transistors in each of said sense amplifiers, a second control signal for activating the pair of pull-up transistors in each of said sense amplifiers and a third control signal for activating the column address decoder to turn on the transfer gates at a plurality of times where each of the first, second and third control signals are supplied at a respective one of said plurality of times;

said timing generator circuit generates, in response to the start signal, one of the first and second control signals, and then the third control signal and finally the other of the first and second control signals in that order to perform sense amplification of the potential difference between the bit lines for a specific sense amplifier, output of the sense-amplified potential difference form the specific sense amplifier to the complementary data lines, and restoring of the bit lines in that order.

2. The peripheral circuit in a dynamic semiconductor memory device as claimed in claim 1, wherein the timing generator circuit comprises a first inverter connected to an input terminal of the timing generator circuit, first and second delay circuits serially connected to said first inverter, an n-channel transistor connected to the ground potential, and a p-channel transistor connected to a specific line having a specific potential, and an output terminal of the first delay circuit is connected to the column address decoders, in which the output of said first inverter is provided to a gate electrode of the n-channel transistor through a second inverter as the first control signal, the output from the first delay circuit is provided to a specific column address decoder through third and fourth inverters as the third control signal, and the output from the second delay circuit is provided to a gate electrode of the p-channel transistor through fifth and sixth inverters as the second control signal.

3. The peripheral circuit in a dynamic semiconductor memory device as claimed in claim 2, further comprising an internal voltage drop circuit for producing a predetermined constant internal voltage drop potential, said internal voltage drop potential being set at the intermediate potential between the ground potential and the power supply potential, and wherein the internal voltage drop potential is applied to said specific line through an internal voltage drop potential line, which is connected to said internal voltage drop circuit, and the p-channel transistor of the timing generator circuit, which is connected to the internal voltage drop potential line.

4. The peripheral circuit in a dynamic semiconductor memory device as claimed in claim 3, wherein the data line bias circuit is connected to the internal voltage drop potential line having said intermediate potential, and comprises switch means connected between the complementary data lines and the internal voltage drop potential line.

5. The peripheral circuit in a dynamic semiconductor memory device as claimed in claim 4, wherein said switch means comprises a p-channel transistor connected between one of the complementary data liens and the internal voltage drop potential line, and a p-channel transistor connected between the other of the complementary data lines and the internal voltage drop potential line.

6. The peripheral circuit in a dynamic semiconductor memory device as claimed in claim 1, wherein the data line bias circuit is connected to an internal voltage drop potential line having the intermediate potential, and comprises switch means connected between the complementary data lines and the internal voltage drop potential line.

7. A peripheral circuit in a dynamic semiconductor memory device comprising:
a plurality of sense amplifiers for sense amplifying a potential difference between complementary bit lines connected thereto;
a main amplifier connected to complementary data lines for further amplifying said potential difference from said sense amplifiers, said complementary data lines being connected to said sense amplifiers by a plurality of transfer gates;
a power supply and a ground for feeding power to the dynamic semiconductor memory device;
a data line bias circuit for biasing the complementary data lines to an intermediate potential between a power supply potential of said power supply and said ground before the main amplifier starts operating so as to improve sensitivity of the main amplifier, said data line bias circuit including,
an internal voltage drop potential line being set at the intermediate potential, and
switch means connected between the voltage drop potential line and the complementary data lines.

8. The peripheral circuit in a dynamic semiconductor memory device as claimed in claim 7, wherein the switch means comprises a p-channel transistor connected between one of the complementary data lines and the internal voltage drop potential line, and a p-channel transistor connected between the other of the complementary data lines and the internal voltage drop potential line.

9. A peripheral circuit in a dynamic semiconductor memory device comprising:
a plurality of sense amplifiers each of which includes a pair of pull-up transistors and a pair of pull-down transistors and is connected to complementary bit lines for sense-amplifying a potential difference between the complementary bit lines;
transfer gates provided between each of said sense amplifiers and complementary data lines;
a plurality of column address decoders for controlling the transfer gates for respective ones of the sense amplifiers;
a main amplifier connected to the complementary data lines for further amplifying said potential difference amplified by the sense amplifiers; and
a timing generator circuit for, in response to a start signal indicating that sense amplification should start, generating a first control signal for activating the pair of pull-down transistors in each of said sense amplifiers, a second control signal for activating the pair of pull-up transistors in each of said sense amplifiers and a third control signal for activating the column address decoders to turn on the transfer gates at a plurality of times where each of the first, second and third control signals are supplied at a respective one of said plurality of times;
said timing generator circuit generates, in response to the start signal, one of the first and second control signals, and then the third control signal and finally the other of the first and second control signals in that order to perform sense amplification of the potential difference between the bit lines for a specific sense amplifier, output of the sense-amplified potential difference from the specific sense amplifier to the complementary data lines, and restoring of the bit lines in that order.

10. The peripheral circuit in a dynamic semiconductor memory device as claimed in claim 9, wherein the timing generator circuit comprises a first inverter connected to an input terminal of the timing of the timing generator circuit, first and second delay circuits serially connected to said first inverter, an n-channel transistor connected to the ground potential, and a p-channel transistor connected to a specific potential, and an output terminal of the first delay circuit is connected to the column address decoders, in which the output of said first inverter is provided to a gate electrode of the n-channel transistor through a second inverter as the first control signal, the output from the first delay circuit is provided to a specific column address decoder through third and fourth inverters as the third control signal, and the output from the second delay circuit is provided to a gate electrode of the p-channel transistor through fifth and sixth inverters as the second control signal.

11. A method of operating a peripheral circuit in a dynamic semiconductor memory device comprising a plurality of sense amplifiers each of which includes a pair of pull-up transistors and a pair of pull-down transistors and is connected to complementary bit lines for sense-amplifying a potential difference between the complementary bit lines, a main amplifier connected to complementary data lines for further amplifying the potential difference amplified by the sense amplifiers, and a plurality of column address decoders for controlling transfer gates provided between each sense amplifier and the complementary data lines, comprising the steps of:

(a) biasing said complementary data lines;

(b) generating one of a first control signal for activating said pair of pull-down transistors in each of said sense amplifiers and a second control signal for activating said pair of pull-up transistors in each of said sense amplifiers;

(c) generating a third control signal for activating said column address decoders to turn on said transfer gates; and (d) generating the other of said first and second control signals, wherein said one of said first and second control signals, said third control signal and the other of said first and second control signals are generated in that order so that sense amplifying of the potential difference between the bit lines for a specific sense amplifier, outputting of the sense-amplified potential difference from the specific sense amplifier to the complementary data lines, and restoring of the bit lines for the specific sense amplifier are performed in that order.

12. The method of operating a peripheral circuit in a dynamic semiconductor device as claimed in claim 11, further comprising the step of producing a predetermined constant internal voltage drop potential by an internal voltage drop circuit, which is set at an intermediate potential between a ground potential and a power supply device for feeding power to the dynamic semiconductor memory, wherein said predetermined constant internal voltage drop potential is applied to bit lines for the specific sense amplifier through an internal voltage drop potential line, which is connected to said internal voltage drop circuit, and a p-channel transistor of a timing generator circuit which generates said first, second and third control signal, which is connected to said internal voltage drop potential line.

* * * * *